United States Patent
Shim

(10) Patent No.: US 9,502,319 B2
(45) Date of Patent: Nov. 22, 2016

(54) DRIVER INTEGRATED CIRCUIT CHIP AND DISPLAY DEVICE HAVING THE SAME

(71) Applicant: SAMSUNG DISPLAY CO., LTD., Yongin, Gyeonggi-Do (KR)

(72) Inventor: Jung-Hoon Shim, Seongnam-si (KR)

(73) Assignee: Samsung Display Co., Ltd., Yongin, Gyeonggi-do (KR)

( * ) Notice: Subject to any disclaimer, the term of this patent is extended or adjusted under 35 U.S.C. 154(b) by 0 days.

(21) Appl. No.: 14/753,627

(22) Filed: Jun. 29, 2015

(65) Prior Publication Data
US 2016/0240447 A1    Aug. 18, 2016

(30) Foreign Application Priority Data

Feb. 13, 2015    (KR) .......................... 10-2015-0022385

(51) Int. Cl.
| | |
|---|---|
| H01L 29/18 | (2006.01) |
| H01L 21/66 | (2006.01) |
| H01L 27/02 | (2006.01) |
| H01L 27/12 | (2006.01) |

(52) U.S. Cl.
CPC ............ *H01L 22/32* (2013.01); *H01L 27/0207* (2013.01); *H01L 27/124* (2013.01); *H01L 27/1218* (2013.01)

(58) Field of Classification Search
CPC ............ H01L 27/1218; H01L 27/0207; H01L 22/32; H01L 27/1225; H01L 29/7869; H01L 27/15
See application file for complete search history.

(56) References Cited

U.S. PATENT DOCUMENTS

| | | | | |
|---|---|---|---|---|
| 5,550,482 | A * | 8/1996 | Sano ................... | G01R 31/2887 324/750.19 |
| 6,496,102 | B1 * | 12/2002 | Kyrtsos ................ | B60T 17/22 340/10.1 |
| 6,952,060 | B2 * | 10/2005 | Goldner ............. | B60G 17/0157 310/12.13 |
| 2007/0079996 | A1 * | 4/2007 | Lee ....................... | G06F 3/044 178/18.06 |
| 2007/0240914 | A1 * | 10/2007 | Lai .......................... | G06F 3/044 178/18.06 |
| 2010/0085326 | A1 * | 4/2010 | Anno ...................... | G06F 3/044 345/174 |
| 2012/0306529 | A1 * | 12/2012 | Omori .................. | G01R 31/048 324/763.01 |
| 2015/0228218 | A1 * | 8/2015 | Shim .................... | G02F 1/13452 345/205 |

FOREIGN PATENT DOCUMENTS

| | | |
|---|---|---|
| KR | 10-2005-0003511 A | 1/2005 |
| KR | 10-2005-0018592 A | 2/2005 |
| KR | 10-2005-0072399 A | 7/2005 |
| KR | 10-2006-0089410 A | 8/2006 |

\* cited by examiner

*Primary Examiner* — Yosef Gebreyesus
(74) *Attorney, Agent, or Firm* — Lee & Morse, P.C.

(57) ABSTRACT

A driver integrated circuit chip includes a plurality of monitoring bumps, a plurality of output bumps, a plurality of first inner wires electrically connected to the output bumps, a plurality of second inner wires, and a plurality of switching circuits are electrically connected to the second inner wires. Each of the second inner wires is electrically connected between an adjacent pair of monitoring bumps. Each of the switching circuits controls a connection between adjacent monitoring bumps.

20 Claims, 6 Drawing Sheets

DRIVER INTEGRATED CIRCUIT CHIP AND DISPLAY DEVICE HAVING THE SAME

CROSS REFERENCE TO RELATED APPLICATION

Korean Patent Application No. 10-2015-0022385, filed on Feb. 13, 2015, and entitled, "Driver Integrated Circuit Chip and Display Device Having The Same," is incorporated by reference herein in its entirety.

BACKGROUND

1. Field

One or more embodiments described herein relate to a driver integrated circuit chip and a display device including a driver integrated circuit chip.

2. Description of the Related Art

A display device may include various driver integrated circuit (IC) chips. One type of IC chip converts image data to a driving signal for driving a display panel. The chip is connected to the display panel using a COG method to reduce manufacturing costs and to provide a stable mounting. In the COG method, an anisotropic conductive film (ACF) is placed between the chip and the display panel and the chip is compressed at high-temperature.

To check whether or not the chip is correctly connected to the display panel, a compression resistance between the chip and the display panel may be measured. Monitoring bumps may be formed on the display panel to measuring the compression resistance. However, an excessive number of monitoring bumps and pads are used. Also, the monitoring pads are located at a peripheral area and perform only one function, e.g., monitoring compression resistance. Thus, the peripheral region of the display panel may not be used effectively.

SUMMARY

Example embodiments provide a driver integrated circuit chip capable of decreasing a size of a peripheral region of a display panel by including inner wires and a switching element electrically connecting or disconnecting between adjacent monitoring bumps.

Example embodiments provide a display device including the driver IC chip.

According to some example embodiments, a driver integrated circuit chip may include a body including a long side and a short side, a plurality of monitoring bumps adjacent to the long side of the body, a plurality of output bumps adjacent to the short side of the body, a plurality of first inner wires electrically connected to the output bumps, respectively, a plurality of second inner wires, each of the second inner wires electrically connected between an adjacent pair of monitoring bumps, and a plurality of switching circuits electrically connected to the second inner wires, wherein each of the switching circuits is to control a connection between adjacent ones of the monitoring bumps.

In one example embodiment, each of the switching circuits may be to turn on to form a short circuit between the adjacent monitoring bumps, the short circuit to allow a compression resistance to be measured between the driver IC chip and a display panel on which the chip is mounted.

In one example embodiment, each of the switching elements may be to turn off to form an open circuit between the adjacent monitoring bumps, the open circuit to allow signals to be transferred from a flexible printed circuit board to a display region of a display panel through the output bumps.

In one example embodiment, the signals may include a clock signal and a start signal.

In one example embodiment, the chip may further include a plurality of dummy bumps adjacent to the long side of the body.

In one example embodiment, each of the second inner wires may be electrically connected between adjacent ones of the dummy bumps, and each of the switching circuits may be electrically connected to a respective one of the second inner wires to control a connection between adjacent dummy bumps.

In one example embodiment, the dummy bumps are electrically connected to the output bumps through the first inner wires.

In one example embodiment, each of the switching elements may be to turn on to form a short circuit between adjacent dummy bumps, the short circuit to allow a compression resistance to be measured between the driver IC chip and a display panel on which the driver IC chip is mounted.

In one example embodiment, each of the switching elements may be to turn off to form an open circuit between adjacent dummy bumps, the open circuit to allow a signal to be transferred from a flexible printed circuit board to a display region of a display panel through the output bumps.

Example embodiments provide a display device including the chip.

According to some example embodiments, a display device may include a display panel including a peripheral region adjacent to a display region, a driver integrated circuit chip in the peripheral region, a first pad in the peripheral region and contacting the chip, and a second pad in the peripheral region and contacting a flexible printed circuit board, wherein the chip includes a body including a long side and a short side, a plurality of monitoring bumps adjacent to the long side of the body, a plurality of output bumps adjacent to the short side of the body, a plurality of first inner wires electrically connected to the output bumps, a plurality of second inner wires electrically connecting between the monitoring bumps, and a plurality of switching circuits electrically connected to the second inner wires.

In one example embodiments, the first pad may include a plurality of output pads connected to the output bumps of the driver IC chip, and the display panel may include a plurality of output wires electrically connected to the output pads and extending to the display region of the display panel.

In one example embodiments, the second pad may include a plurality of monitoring pads in the peripheral, region of the display panel and connected to the monitoring bumps of the driver IC chip, and the display panel may include a plurality of monitoring wires electrically connected to the monitoring pads and extending to the display region of the display panel.

In one example embodiments, the output wires may be electrically connected to the monitoring wires through the output bumps and the first inner wires of the driver IC chip.

In one example embodiments, the second pad may include a plurality of driving pads, a plurality of test pads, and a plurality of direct current power pads.

In one example embodiments, the display device may further include a flexible printed circuit board to perform a lighting test of the display panel, wherein a clock signal and a start signal are to be provided to the display panel through at least one of the output bumps of the driver IC chip and at least one of the monitoring pads of the second pad when the flexible printed circuit board is connected to the second pad.

In one example embodiments, the display device may further include a flexible printed circuit board to monitor compression resistance, wherein each of the switching circuits may be to be turned on and compression resistance between the display panel and the driver IC chip may be to be measured when the flexible printed circuit board may be connected to the second pad.

In one example embodiments, the display device may further include a flexible printed circuit board to drive the display panel, wherein each of the switching circuits may be to be turned off and a clock signal and a start signal may be to be provided to the display panel through at least one of the monitoring pads of the second pad and at least one of the output bumps of the driver IC chip when the flexible printed circuit board is connected to the second pad.

In one example embodiments, the driver IC chip may be electrically connected to the display panel through an anisotropic conductive film.

In one example embodiments, the display panel may include an organic light emitting display panel or a liquid crystal display panel.

In one example embodiments, the driver IC may include a plurality of dummy bumps adjacent to the long side of the body, each of the second inner wires is electrically connected between adjacent ones of the dummy bumps, and each of the switching circuits is electrically connected to a respective one of the second inner wires to control a connection between adjacent ones of the dummy bumps.

Therefore, the driver IC chip according to example embodiments may include the switching element and the inner wire. The switching element may control the connection between the adjacent monitoring bumps. The inner wire may be connected to the output bumps. So, when the driver IC chip receives outer signals through the flexible printed circuit board, regardless of a type of the outer signals, the outer signals may be transferred to the output bumps or the monitoring bumps according to an on-off state of the switching element. Furthermore, a display device including the driver IC chip may use the monitoring pad and the output pad in a various ways using the inner wire and the switching element. For example, the monitoring pad may be used for measuring the compression resistance between the driver IC chip and the display panel including the driver IC chip by turning on the switching element, or the monitoring pad may be used for transferring the clock signal and/or start signal to the display region of the display panel by turning off the switching element. That is, the number of pads may be decreased by using the monitoring pad for additional function. As a result, a size of the peripheral region of the display panel may be reduced, and the display device has a thin thickness and a lightweight.

BRIEF DESCRIPTION OF THE DRAWINGS

Features will become apparent to those of skill in the art by describing in detail exemplary embodiments with reference to the attached drawings in which.

DETAILED DESCRIPTION

Figure 1:
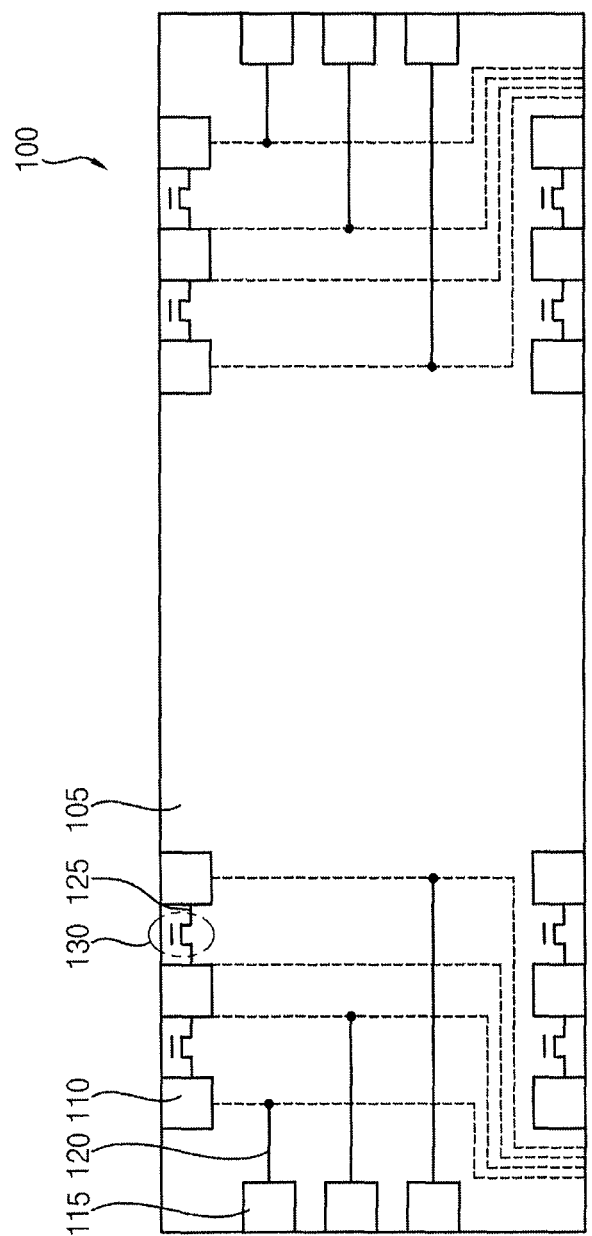
FIG. 1 illustrates an embodiment of a driver IC chip.

Example embodiments will now be described more fully hereinafter with reference to the accompanying drawings; however, they may be embodied in different forms and should not be construed as limited to the embodiments set forth herein. Rather, these embodiments are provided so that this disclosure will be thorough and complete, and will fully convey exemplary implementations to those skilled in the art. The embodiments may be combined to form additional embodiments. Like reference numerals refer to like elements throughout.

FIG. 1 illustrates an embodiment of a driver IC chip 100 which includes a body unit 105, a plurality of monitoring bumps 110, a plurality of output bumps 115, a plurality of first inner wires 120, a plurality of second inner wires 125, and a plurality of switching elements 130. For convenience of description, the monitoring bumps 110 are on side portions of a upper long side of the body unit 105, e.g., a first long side. In another embodiment, the monitoring bumps may be on one or more other sides of the body unit 105. Also, when the driver IC chip 100 is mounted on a display panel (e.g., display panel 305 in FIG. 3), dotted lines are used to indicate electrical connections between the first inner wires 120 of the driver IC chip 100 and corresponding monitoring wires 360 of the display panel 305.

The body unit 105 may include an embedded driver IC to convert signals from an external source (e.g., a flexible printed circuit board (FPCB)) to driving signals. The body unit 105 may include, for example, a flexible material such as a polyimide-based resin, a polyethylene terephthalate resin, or a polyethylene naphthalate resin.

The monitoring bumps 110 are adjacent to two side portions of a first long side of the body unit 105 and two side portions of a second long side opposing the first long side. Three monitoring bumps 110 are on each of the left side portion of the first long side, the right side portion of the first long side, the left side portion of the second long side, and the right side portion of the second long side. Therefore, in this embodiment, twelve monitoring bumps are on the body unit 105. The monitoring bumps 110 may include, for example, metal such as copper, tungsten, silver, or aluminum.

The monitoring bumps 110 have a predetermined shape (e.g., rectangular plan shapes) and may be substantially the same size. In another embodiment, the monitoring bumps 110 may have other shapes such as but not limited to a square, a hexagon, a circle, an ellipse, or a polygon. In one embodiment, the monitoring bumps 110 may have the same or different plan shapes. In one example embodiment, the monitoring bumps 110 may be electrically connected to or disconnected from each other by the second inner wires 125 connected to the switching elements 130. The monitoring bumps 110 may not only be used to measure compression resistance between the driver IC chip 100 and a display panel (e.g., display panel 305 in FIG. 3), but also may be used to perform one or more other operations. The one or more other operations may include, for example, outputting a driving signal, a test signal, or a direct current (DC) power signal.

The output bumps 115 are adjacent to a first short side and a second short side opposing the first short side. The output bumps 115 may include substantially the same material as the monitoring bumps 110. Also, the output bumps 115 may have substantially the same shape and/or size as the monitoring bumps 110. In one example embodiment, the output bumps 115 may be electrically connected to respective ones of the first inner wires 120. For example, one end of each first inner wire 120 may be electrically connected to a respective one of the output bumps 115. The other end of each first inner wire 120 may be electrically connected to a respective one of the monitoring wires (e.g., monitoring wire 360 FIG. 3). One or more of the first inner wires 120 may transfer a clock signal (CLK), a start signal (FLM), a test signal, a DC power, or another signal, from the monitoring wires 360 to the output bumps 115 based on the states of the switching elements 130.

The second inner wires 125 are electrically connected between the monitoring bumps 110. In one example embodiment, the switching elements 130 are electrically connected to the second inner wires to control a connection between the monitoring bumps 110. For example, when each switching element 130 is turned on, a short circuit may be formed between adjacent ones of the monitoring bumps 110. When each switching element 130 is turned off, an open circuit may be formed between adjacent ones of the monitoring bumps 110.

Figure 3:
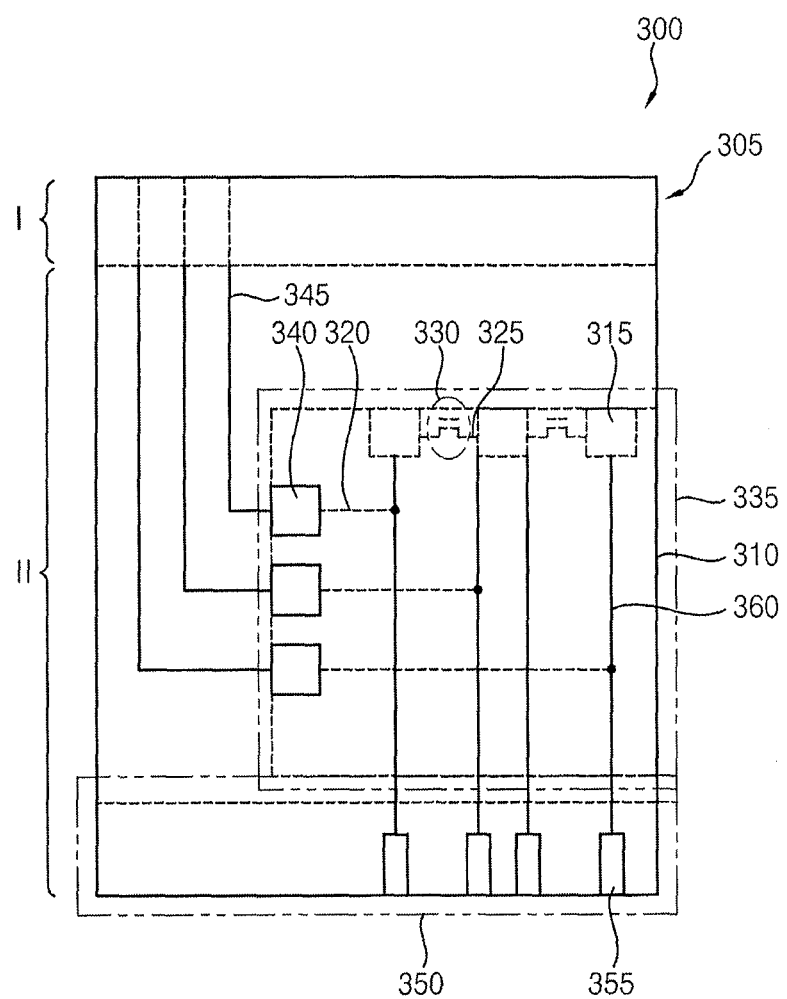
FIG. 3 illustrates an embodiment of a display device.

When a short circuit is formed between adjacent monitoring bumps 110, the monitoring bumps 110 may be used to measure compression resistance between the driver IC chip 100 and the display panel (e.g., display panel 305) with monitoring pads (e.g., 355 in FIG. 3). When an open circuit is formed between the monitoring bumps 110, the monitoring bumps 110 may not be used to measure compression resistance between the driver IC chip 100 and the display panel 305. Instead, signals (e.g., the clock signal, the start signal, the test signal, or another signal) may be transferred from an external source (e.g., a flexible printed circuit board) to the display panel through the output bumps 115.

In one proposed driver IC chip, in order to check compression resistance between a driver IC chip and a display panel on which the driver IC chip is mounted, monitoring bumps are on up, down, left, and right sides of driver IC chip. To monitor compression resistance, monitoring pads connected to the monitoring bumps are on a peripheral region of the display panel. However, the monitoring pads perform only one function and the monitoring bumps perform only one function. Consequently, the monitoring pads and the monitoring bumps may not be used efficiently. Also, the driver IC chip and the peripheral region of the display panel may not be used effectively.

In accordance with one or more embodiments, the driver IC chip 100 includes the first inner wires 120 connected to output bumps 115 and the switching elements 130 that form a short circuit and/or open circuit between adjacent the monitoring bumps 110. When signals are provided from an external source (e.g., a flexible printed circuit board), the signals may be applied to the output bumps 115 or the monitoring bumps 110 based on the states of the switching elements 130 regardless of the type of the outer signals. Thus, the monitoring bumps 110 and the output bumps 115 may be selectively used based on operation of the switching elements 130, to thereby make efficient use of the driver IC chip 100.

Figure 2:
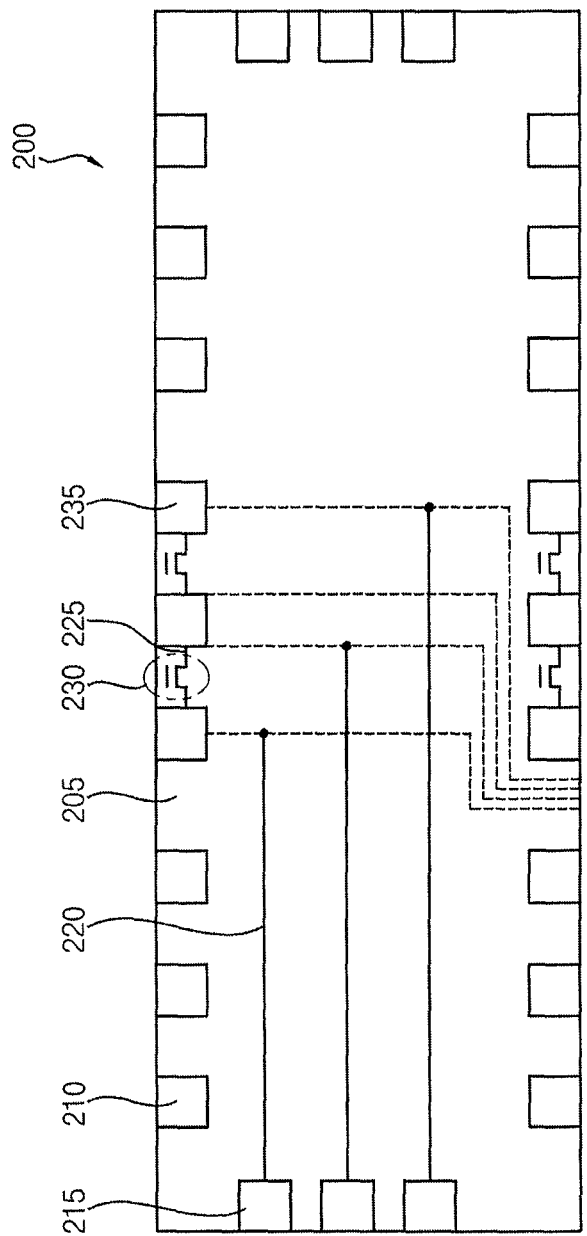
FIG. 2 illustrates another embodiment of a driver IC chip.

FIG. 2 illustrates another embodiment of a driver IC chip 200 which is substantially the same as the driver IC chip 100 in FIG. 1, except that a plurality of dummy bumps are included.

Referring to FIG. 2, a driver IC chip 200 includes a body unit 205, a plurality of monitoring bumps 210, a plurality of output bumps 215, a plurality of first inner wires 220, a plurality of second inner wires 225, a plurality of switching elements 230, and a plurality of dummy bumps 235. In FIG. 2, dotted lines correspond to connections between the inner wires 220 and dummy wires of a display panel (e.g., 305 in FIG. 3) when the driver IC chip 200 is electrically connected to the display panel.

The dummy bumps 235 are on one side (e.g., a first long side) and another side (e.g., a second long side) opposing the first long side of the body unit 205. In FIG. 2, the monitoring bumps 210 are on two side portions of the first long side and/or two side portions of the second long side of the body unit 205 and the dummy bumps 235 are between monitoring bumps 210. In another embodiment, the dummy bumps 235 may be between adjacent the monitoring bumps 210 or on a first short side of the body unit 205 and a second short side opposing the first short side. Also, in one example embodiment, adjacent dummy bumps 235 may be connected to each other by the second inner wires 225. In this case, an on-off state of the dummy bumps 235 may be determined by the switching elements 230 that are electrically connected to the second inner wires 225.

For example, when each switching element 230 is turned on and a short circuit is formed between the adjacent dummy bumps 235, signals are transferred from an external source (e.g., a flexible printed circuit board) to the monitoring bumps 210. Thus, compression resistance may be measured between the driver IC chip 200 and the display panel on which the driver IC chip 200 is mounted. The signals may be, for example, voltages for measuring the compression resistance.

When each switching element 230 is turned off and an open circuit is formed between adjacent dummy bumps 235, a signal (e.g., a clock signal, a start signal, etc.) is transferred from an external source (e.g., a flexible printed circuit board) to a display region of the display panel through at least one of the output bumps 215. Thus, the dummy bumps 235 may be used for measuring compression resistance and for driving the display panel. As a result, a wasted space may be reduced or minimized by the dummy bumps 235.

FIG. 3 illustrates an embodiment of a display device 300 which includes a display panel 305, a driver IC chip 310, a first pad 335, and a second pad 350. The driver IC chip 310 may be substantially the same as the driver IC chip 100 in FIG. 1 and the driver IC chip 310 is described as being mounted on or to the display panel 305. In another case, the driver IC chip 310 that is substantially the same as the driver IC chip 200 in FIG. 2 may be mounted on the display panel 305.

The display panel 305 includes a display region I and a peripheral region II adjacent to the display region I. The display panel 305 includes a plurality of pixels. The display panel 305 may be, for example, an organic light emitting display panel. When the display panel 305 is an organic light emitting display panel, each of the pixels may include an organic light emitted diode. In another embodiment, the display panel 305 may be a liquid crystal display having a liquid crystal layer.

The driver IC chip 310 is in the peripheral region II of the display panel 305 and is electrically connected to the display panel 305 through, for example, an anisotropic conductive film (ACF). For example, the driver IC chip 310 may be located on the display panel 305 having the ACF. The driver IC chip 310 may be mounted on the display panel 305 by compressing the driver IC chip 310 at high-temperature. The driver IC chip 310 may be electrically connected to the display panel 305, for example, when conductive balls of the ACF are broken during the compression process.

As illustrated in FIG. 3, the driver IC chip 310 may include a body unit, a plurality of monitoring bumps 315, a plurality of output bumps, a plurality of first inner wires 320, a plurality of second inner wires 325, and a plurality of switching elements 330. Also, the driver IC chip 310 may include a driver IC that receives a control signal and/or a data signal from an external source and generates a scan signal and/or a data signal. For a convenience of description, some elements of the driver IC chip 310 are illustrated using a dotted line.

The first pads 335 are in the peripheral region II of the display panel 305. The first pad 335 may contact the driver IC chip 310 and may include a plurality of output pads 340 and a plurality of output wires 345.

The output pads 340 may be adjacent to a first short side and a second short side opposing the first short side. In FIG. 3, for a convenience of description, the output pads 340 on the first short side of the driver IC chip 310 are referred to. Each of the output pads 340 may receive driving signals from the driver IC chip 310. The driving signals may include, for example, one or more of a clock signal (CLK) or a start signal (FLM). The output pads 340 are electrically connected to the output wire 345 which extends to the display region I of the display panel 305. The output pads 340 provide the driving signals to the display region I of the display panel 305.

The second pad 350 is in the peripheral region II of the display panel 305. The second pad 350 contacts an external signal source (e.g., a flexible printed circuit board) and includes a plurality of monitoring pads 355 and a plurality of monitoring wires 360.

The monitoring pads 355 are adjacent to two side portions of a first long side and two side portions of a second long side opposing the first long side. For convenience of description, the monitoring pads 355 are illustrated to be at one end of the first long side. In one example embodiment, adjacent monitoring pads 355 may be electrically connected to each other by a respective one of the second inner wires 325 of the driving chip 310. Because the switching elements 330 are electrically connected to the second inner wires 325, the monitoring pads 355 may be connected or disconnected based on the on-off state of the switching elements 330.

In one example embodiment, the monitoring pads 355 provide a voltage to the display region I of the display panel 305 through the monitoring wires 360. The voltage may be used as a basis for measuring compression resistance. The monitoring pads 355 may also be used to provide signals (e.g., a driving signal, a test signal, a DC power, etc.) to the display region I of the display panel 305 through the monitoring wires 360. The monitoring bumps 315 of the driver IC chip 310 may be disconnected to each other by controlling of the switching elements 330.

Thus, the signals (e.g., a driving signal, a test signal, the DC power, etc.) may be provided to the display region I of the display panel 305. In this case, the monitoring pads 355 may not only be used for measuring compression resistance but also may be used to perform an additional function. Therefore, the availability of the monitoring pads 355 may be increased, and the number of pads (e.g., a driving pad, a test pad, a DC power pad, etc.) may be reduced or minimized.

For example, when the monitoring pads 355 simultaneously perform a role as a measuring pad compression resistance and a driving pad, the number of the driving pads may be reduced, e.g., in this example to about sixteen. When the monitoring pads 355 simultaneously perform a role as a measuring pad compression resistance and a test pad, the number of the driving pads may be reduced, e.g., to about twelve. When the monitoring pads 355 simultaneously perform a role as a measuring pad for compression resistance and a DC power pad, the number of the driving pads may be reduced, e.g., to about twelve.

In one type of display device that has been proposed, when the driver IC chip is mounted on the display panel by a COG method, compression resistance between the driver IC chip and the display panel may be measured to check whether or not the driver IC chip is correctly mounted on the display panel. In this case, twelve monitoring bumps for measuring the compression resistance are on the driver chip, and sixteen monitoring pads for monitoring the compression resistance are in the peripheral region of the display panel. Therefore, space utilization is restricted.

In accordance with one or more embodiments, the display device may include monitoring pads that perform multiple functions, e.g., the function of monitoring compression resistance and the function of outputting the driving signal. Thus, the size of the peripheral region II of the display panel 305 may be reduced using the monitoring pads 355 because the monitoring pads 355 are used in various ways. For example, a cutting margin (e.g., in a L-cut and/or C-cut) of the peripheral region II of the display panel 305 may be reduced to make room for more elements, e.g., a camera, a sensor, etc. Also, the strength of the display device 300 may be substantially improved.

Figure 4:
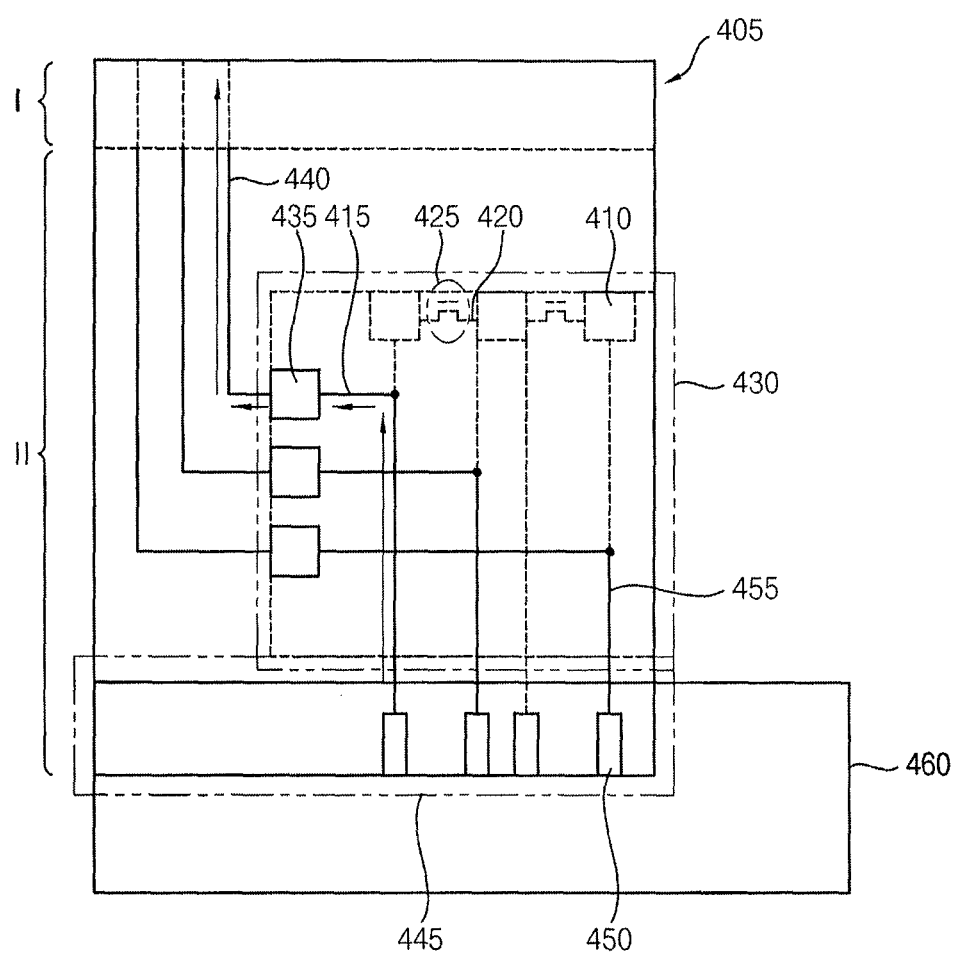
FIG. 4 illustrates an example for performing a lighting test.

FIG. 4 illustrates an example in which a flexible printed circuit board for a lighting test of a display panel contacts a second pad of a display device of FIG. 3. Referring to FIG. 4, while a driver IC chip is not mounted on a display panel 405, a flexible printed circuit board 460 for a lighting test of the display panel may contact a second pad 445. In FIG. 4, some elements are indicated by dotted lines in order to take into consideration electrically connections of the driver IC chip on the display panel 405 for performing the lighting test.

During the lighting test of the display panel, the monitoring bumps 410 of the driver IC chip are not connected to each other because the driver IC chip is not mounted on the display panel 405. In this case, monitoring pads 450 of a second pad 445 are connected to the flexible printed circuit board 460 for the lighting test. Therefore, as illustrated by the arrow in FIG. 4, a clock signal and a start signal are transferred from the flexible printed circuit board 460 for the lighting test to a display region I of the display panel 405 through at least one of the first inner wires 415 of the driver IC chip and at least one of the output bumps 435 of the driver IC chip.

Thus, various types of pads (including the monitoring pads 450) may be used for the lighting test of the display panel. Therefore, the number of pads for the lighting test may be markedly reduced. Furthermore, the size of the second pad 445 may be reduced.

Figure 5:
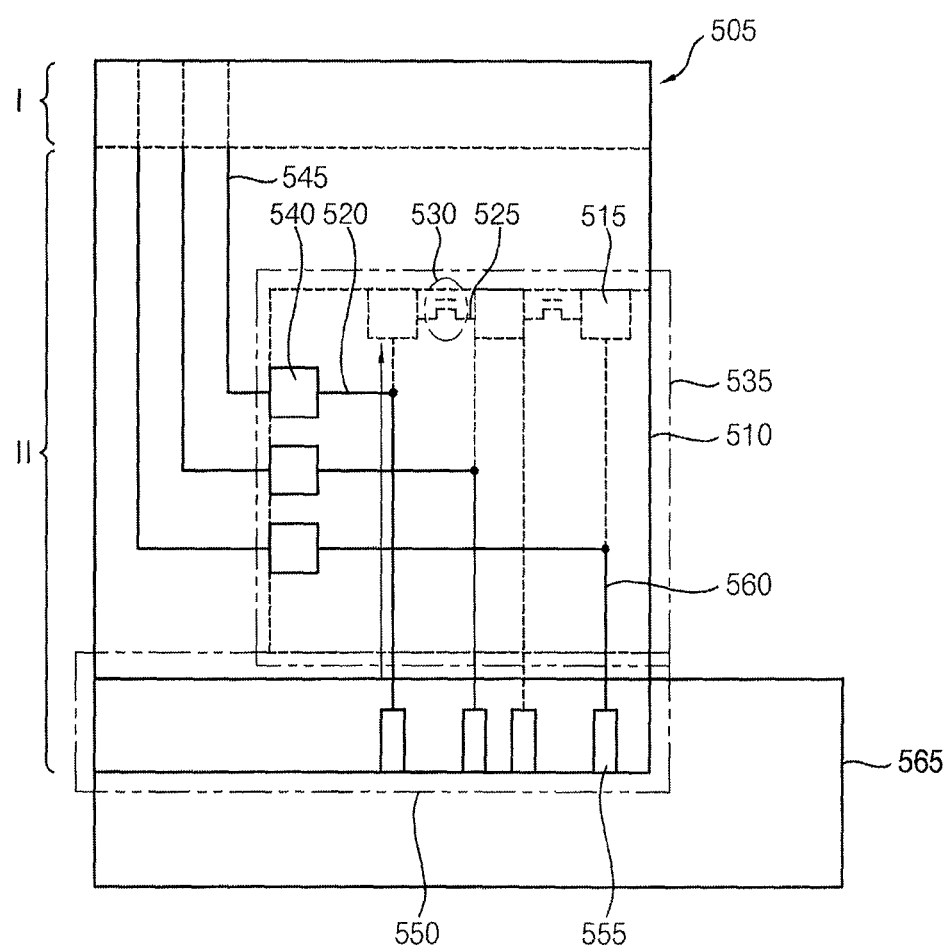
FIG. 5 illustrates an example for monitoring compression resistance.

FIG. 5 illustrates an example in which a flexible printed circuit board for monitoring compression resistance contacts a second pad of display device of FIG. 3. Referring to FIG. 5, after a driver IC chip 510 is mounted on a display panel 505, compression resistance between the driver IC chip 510 and the display panel 505 may be measured by connecting a flexible printed circuit board 565 for monitoring compression resistance with a second pad 550. In this case, a short circuit between adjacent monitoring bumps 515 of the driver IC chip is maintained by a corresponding switching element 530 of the driver IC chip 510.

Therefore, as indicated by the arrow in FIG. 5, a voltage and a current for measuring the compression resistance are transferred from the flexible printed circuit board 565 for monitoring compression resistance to the monitoring bumps 515 of the driver IC chip. Thus, the compression resistance between the driver IC chip 510 and the display panel 505 may be measured. Because the first inner wires 520 of the driver IC chip 510 and output wires 545 of a first pad 535 are in a floating state, current may not flow. Thus, monitoring of the compression resistance between the driver IC chip 510 and the display panel 505 may not be affected.

Figure 6:
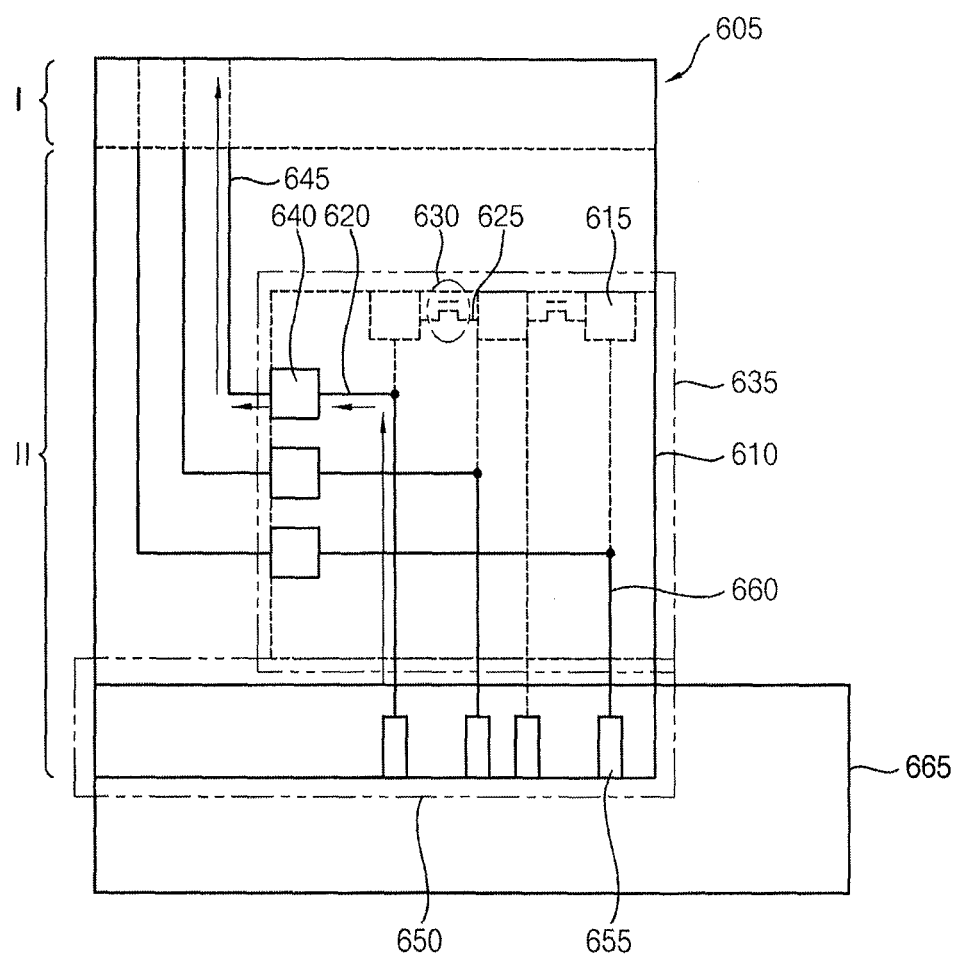
FIG. 6 illustrates an example for driving a display panel.

FIG. 6 illustrates an example in which a flexible printed circuit board for driving a display panel contacts a second pad of display device of FIG. 3. Referring to FIG. 6, a display region I of a display panel 605 may be driven by contacting a flexible printed circuit board 665 for driving the display panel with a second pad 650. In this case, all of monitoring bumps 615 of a driver IC chip 610 are in an open-circuit state by turning off switching elements 730 in a driver IC chip 610.

Therefore, as indicated by the arrow in FIG. 6, external signals such as a clock signal and a start signal provided through the flexible printed circuit board 665 for driving the display panel may be output to the display region I of the display panel 605 through output bumps of the driver IC chips 610, output pads 640 of a first pad 635, and output wires 645 of the first pad 635.

For example, various types of pads (including monitoring pads 655) are used to drive the display panel 605. Thus, the number of the driving pads may be markedly decreased. As a result, wasted space of a display device may be reduced by decreasing the size of the second pad 650 on which the driving pads are disposed.

The present embodiments may be applied to a display device having the driving IC chip. For example, the present inventive concept may be applied to a television, a digital television, a 3-dimensional (3D) television, a personal computer (PC), a notebook computer, a tablet PC, a cellular phone, a smart phone, a smart pad, a personal digital assistant (PDA), etc.

Example embodiments have been disclosed herein, and although specific terms are employed, they are used and are to be interpreted in a generic and descriptive sense only and not for purpose of limitation. In some instances, as would be apparent to one of skill in the art as of the filing of the present application, features, characteristics, and/or elements described in connection with a particular embodiment may be used singly or in combination with features, characteristics, and/or elements described in connection with other embodiments unless otherwise indicated. Accordingly, it will be understood by those of skill in the art that various changes in form and details may be made without departing from the spirit and scope of the invention as set forth in the following claims.

What is claimed is:

1. A driver integrated circuit chip, comprising:
a body including a long side and a short side;
a plurality of monitoring bumps adjacent to the long side of the body;
a plurality of output bumps adjacent to the short side of the body;
a plurality of first inner wires electrically connected to the output bumps, respectively;
a plurality of second inner wires, each of the second inner wires electrically connected between an adjacent pair of monitoring bumps; and
a plurality of switching circuits electrically connected to the second inner wires, wherein each of the switching circuits is to control a connection between adjacent ones of the monitoring bumps.

2. The chip as claimed in claim 1, wherein each of the switching circuits is to turn on to form a short circuit between the adjacent monitoring bumps, the short circuit to allow a compression resistance to be measured between the driver IC chip and a display panel on which the chip is mounted.

3. The chip as claimed in claim 1, wherein each of the switching elements is to turn off to form an open circuit between the adjacent monitoring bumps, the open circuit to allow signals to be transferred from a flexible printed circuit board to a display region of a display panel through the output bumps.

4. The chip as claimed in claim 3, wherein the signals include a clock signal and a start signal.

5. The chip as claimed in claim 1, further comprising:
a plurality of dummy bumps adjacent to the long side of the body.

6. The chip as claimed in claim 5, wherein:
each of the second inner wires is electrically connected between adjacent ones of the dummy bumps, and
each of the switching circuits is electrically connected to a respective one of the second inner wires to control a connection between adjacent dummy bumps.

7. The chip as claimed in claim 6, wherein the dummy bumps are electrically connected to the output bumps through the first inner wires.

8. The chip as claimed in claim 7, wherein each of the switching elements is to turn on to form a short circuit between adjacent dummy bumps, the short circuit to allow a compression resistance to be measured between the driver IC chip and a display panel on which the driver IC chip is mounted.

9. The chip as claimed in claim 7, wherein each of the switching elements is to turn off to form an open circuit between adjacent dummy bumps, the open circuit to allow a signal to be transferred from a flexible printed circuit board to a display region of a display panel through the output bumps.

10. A display device, comprising:
a display panel including a peripheral region adjacent to a display region;
a driver integrated circuit chip in the peripheral region;
a first pad in the peripheral region and contacting the chip; and
a second pad in the peripheral region and contacting a flexible printed circuit board, wherein the chip includes:
a body including a long side and a short side;
a plurality of monitoring bumps adjacent to the long side of the body;
a plurality of output bumps adjacent to the short side of the body;
a plurality of first inner wires electrically connected to the output bumps;
a plurality of second inner wires electrically connecting between the monitoring bumps; and
a plurality of switching circuits electrically connected to the second inner wires.

11. The display device as claimed in claim 10, wherein:
the first pad includes a plurality of output pads connected to the output bumps of the driver IC chip, and the display panel includes a plurality of output wires electrically connected to the output pads and extending to the display region of the display panel.

12. The display device as claimed in claim 11, wherein:
the second pad includes a plurality of monitoring pads in the peripheral region of the display panel and connected to the monitoring bumps of the driver IC chip, and the display panel includes a plurality of monitoring wires electrically connected to the monitoring pads and extending to the display region of the display panel.

13. The display device as claimed in claim 12, wherein the output wires are electrically connected to the monitoring wires through the output bumps and the first inner wires of the driver IC chip.

14. The display device as claimed in claim 13, wherein the second pad includes:
a plurality of driving pads;
a plurality of test pads; and
a plurality of direct current power pads.

15. The display device as claimed in claim 10, further comprising:
a flexible printed circuit board to perform a lighting test of the display panel, wherein a clock signal and a start signal are to be provided to the display panel through at least one of the output bumps of the driver IC chip and at least one of the monitoring pads of the second pad when the flexible printed circuit board is connected to the second pad.

16. The display device as claimed in claim 10, further comprising:
a flexible printed circuit board to monitor compression resistance,
wherein each of the switching circuits is to be turned on and compression resistance between the display panel and the driver IC chip is to be measured when the flexible printed circuit board is connected to the second pad.

17. The display device as claimed in claim 10, further comprising:
a flexible printed circuit board to drive the display panel,
wherein each of the switching circuits is to be turned off and a clock signal and a start signal is to be provided to the display panel through at least one of the monitoring pads of the second pad and at least one of the output bumps of the driver IC chip when the flexible printed circuit board is connected to the second pad.

18. The display device as claimed in claim 10, wherein the driver IC chip is electrically connected to the display panel through an anisotropic conductive film.

19. The display device as claimed in claim 10, wherein the display panel includes an organic light emitting display panel or a liquid crystal display panel.

20. The display device as claimed in claim 10, wherein:
the driver IC includes a plurality of dummy bumps adjacent to the long side of the body,
each of the second inner wires is electrically connected between adjacent ones of the dummy bumps, and
each of the switching circuits is electrically connected to a respective one of the second inner wires to control a connection between adjacent ones of the dummy bumps.

* * * * *